United States Patent
Zhang et al.

(10) Patent No.: US 10,103,245 B2
(45) Date of Patent: *Oct. 16, 2018

(54) EMBEDDED SHAPE SIGE FOR STRAINED CHANNEL TRANSISTORS

(71) Applicant: STMicroelectronics, Inc., Coppell, TX (US)

(72) Inventors: John H. Zhang, Altamont, NY (US); Pietro Montanini, Albany, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/664,225

(22) Filed: Jul. 31, 2017

(65) Prior Publication Data

US 2017/0352741 A1  Dec. 7, 2017

Related U.S. Application Data

(60) Continuation of application No. 14/969,911, filed on Dec. 15, 2015, now Pat. No. 9,755,051, which is a division of application No. 13/931,509, filed on Jun. 28, 2013, now Pat. No. 9,245,955.

(51) Int. Cl.
| | |
|---|---|
| *H01L 29/66* | (2006.01) |
| *H01L 29/78* | (2006.01) |
| *H01L 21/265* | (2006.01) |
| *H01L 21/8238* | (2006.01) |
| *H01L 27/092* | (2006.01) |

(Continued)

(52) U.S. Cl.
CPC .. *H01L 29/66636* (2013.01); *H01L 21/26586* (2013.01); *H01L 21/823807* (2013.01); *H01L 21/823814* (2013.01); *H01L 21/823864* (2013.01); *H01L 27/092* (2013.01); *H01L 29/1054* (2013.01); *H01L 29/165* (2013.01); *H01L 29/66568* (2013.01); *H01L 29/66651* (2013.01); *H01L 29/7834* (2013.01); *H01L 29/66628* (2013.01)

(58) Field of Classification Search
CPC .................................................. H01L 29/7848
See application file for complete search history.

(56) References Cited

U.S. PATENT DOCUMENTS

| | | |
|---|---|---|
| 4,908,332 A | 3/1990 | Wu |
| 5,658,811 A | 8/1997 | Kimura et al. |
| 9,034,741 B2 | 5/2015 | Adam et al. |

(Continued)

OTHER PUBLICATIONS

Yang et al.,"Dual Stress Liner for High Performance sub-45nm Gate Length SOI CMOS Manufacturing," Electron Devices Meeting, 2004, IEDM Technical Digest. IEEE International, 2004, 3 pages.

*Primary Examiner* — Tucker J Wright
(74) *Attorney, Agent, or Firm* — Seed IP Law Group LLP

(57) ABSTRACT

An integrated circuit die includes a silicon substrate. PMOS and NMOS transistors are formed on the silicon substrate. The carrier mobilities of the PMOS and NMOS transistors are increased by introducing tensile stress into the channel regions of the NMOS transistors and compressive stress into the channel regions of the PMOS transistors. Tensile stress is introduced by including a region of SiGe below the channel region of the NMOS transistors. Compressive stress is introduced by including regions of SiGe in the source and drain regions of the PMOS transistors.

25 Claims, 8 Drawing Sheets

(51) Int. Cl.
*H01L 29/10* (2006.01)
*H01L 29/165* (2006.01)

(56) References Cited

U.S. PATENT DOCUMENTS

| | | |
|---|---|---|
| 2005/0263825 A1 | 12/2005 | Frohberg et al. |
| 2007/0138570 A1 | 6/2007 | Chong et al. |
| 2009/0085125 A1 | 4/2009 | Kim et al. |
| 2009/0134381 A1 | 5/2009 | Shimamune et al. |
| 2011/0042758 A1 | 2/2011 | Kikuchi et al. |
| 2011/0259936 A1 | 10/2011 | Lichtensteiger |
| 2011/0287600 A1 | 11/2011 | Cheng et al. |
| 2012/0043624 A1 | 2/2012 | Liang et al. |
| 2012/0049250 A1* | 3/2012 | Park ............... H01L 21/823807 257/288 |
| 2012/0181634 A1 | 7/2012 | Yin et al. |
| 2013/0240956 A1 | 9/2013 | Hou et al. |
| 2014/0077275 A1 | 3/2014 | Adam et al. |

* cited by examiner

EMBEDDED SHAPE SIGE FOR STRAINED CHANNEL TRANSISTORS

RELATED APPLICATIONS

This patent application is a continuation of U.S. patent application Ser. No. 14/969,911, filed Dec. 15, 2015, which is a divisional of U.S. patent application Ser. No. 13/931,509 filed Jun. 28, 2013, issued Jan. 26, 2016 as U.S. Pat. No. 9,245,955.

BACKGROUND

Technical Field

The present disclosure relates to a method and structure for forming strained transistors.

Description of the Related Art

Scaling of transistor size has served to improve switching speed (the maximum speed at which a transistor can be switched off or on), conduction properties, and circuit density. However as CMOS technology has reached the 32 nm and 16 nm nodes, scaling has become more difficult and new means for improving device function have been sought.

One means for improving transistor properties is to introduce strain in the channel of the transistor. This has been done by carefully forming strain inducing layers of materials above the channel region of the transistor. The strain inducing layers induce either a tensile or compressive strain on the channel region of the transistor, according to the type of the transistor, and in so doing improve carrier mobility in the channel region. The improved carrier mobility enhances current conduction in the channel region, which in turn allows for lower power dissipation and enhanced transconductance. The enhanced transconductance means that a larger current can be induced in the channel with a smaller gate to source voltage, allowing for lower supply voltages to be used on chip. The lower supply voltages allow for further reduction of power dissipation It is known in the art that a transistor subjected to different types of stress increases the mobility of the charge carriers in the channel region. For example, creating a tensile stress in the channel region increases the mobility of electrons and, depending on the magnitude of the stress, increases in mobility of up to 20% may be obtained. This, in turn, directly translates into an increase in conductivity and faster speed. Similarly, compressive stress in the channel region may increase the mobility of holes, thereby providing enhanced performance of those transistors which conduct based on the mobility of holes.

Consequently, it is has been proposed to introduce a compressive stress into the channel region of N-type transistors and a tensile stress into the channel region of P-type transistors. A number of structures have been proposed in the prior art to induce stress in these respective channel regions.

A common MOS transistor includes source, drain, and channel regions formed in a mono crystalline semiconductor substrate. A gate electrode is positioned over the channel region. Sidewall spacers are formed adjacent the gate electrode.

Strain is induced in the channel region of the transistor by depositing a dielectric layer over the gate electrode, the sidewall spacers, and the source and drain regions. Silicon nitride is commonly used for a strain inducing dielectric layer 56, but other strain inducing layers are also used. The $Si_3N_4$ strain inducing layer may be deposited by means of a low pressure chemical vapor deposition (LPCVD), plasma enhanced chemical vapor deposition (PECVD), or other suitable methods.

A silicon nitride layer 56 can have compressive or tensile strain characteristics depending on the conditions during formation of the silicon nitride. Silicon nitride can be formed by PECVD in a chamber in the presence of silane ($SiH_4$), $N_2$, and ammonia ($NH_3$). By varying the silane flow rate, the ammonia flow rate, the $N_2$ flow rate, the pressure, temperature (both before and after deposition), and the low and high frequency power outputs in the deposition chamber, a silicon nitride layer can be made to have varying levels of compressive or tensile strain.

A structure of this type is described and shown in detail in U.S. Patent Application Publication No. 2005/0263825 to Fulmberg et al., (the '825 application) which is incorporated herein by reference.

Another method for increasing carrier mobility in an NMOS device is to implant carbon and phosphorus into the silicon source and drain regions of the transistor. The carbon and phosphorus are implanted into the silicon with an acceleration energy of 15 KeV. If the implantation is performed at room temperature, many residual crystal defects occur in the silicon substrate. Such crystal defects include dislocations, stacking faults, and arrange defects. These defects can be partially avoided if the implantation is performed at very cold temperatures, for example −60°. However, implanting at this low temperature is also very expensive and time-consuming.

BRIEF SUMMARY

One embodiment is of the present disclosure an integrated circuit die including a silicon substrate. A PMOS transistor and an NMOS transistor are formed in the silicon substrate. The channel region of the PMOS transistor is strained in a compressive manner. The channel region of the NMOS transistor is strained in a tensile manner.

The PMOS transistor includes source and drain regions in the silicon substrate. First trenches are isotropically etched in the PMOS source and drain regions. SiGe is grown in the first trenches. Due to the shape of the first trenches, a compressive strain is induced on the silicon PMOS channel region between the SiGe filled first trenches.

The NMOS transistor includes source and drain regions in the silicon substrate. A second trench is etched in the silicon substrate between the NMOS source and drain regions. The second trench is filled with SiGe. A thin silicon NMOS channel region is epitaxially grown on the SiGe in the second trench. The SiGe in the second trench induces a tensile strain on the silicon NMOS channel region.

One embodiment is a method for forming a compressively strained PMOS transistor and a NMOS transistor under tensile strain. The method includes implanting dopants into a silicon substrate to form source and drain regions for the PMOS and NMOS transistors. The method further includes isotropically etching first trenches in the source and drain regions of the PMOS transistor, anisotropically etching a second trench in the silicon between the source and drain regions of the NMOS transistor, and simultaneously growing SiGe in the first and second trenches. An epitaxial silicon layer is then grown on the SiGe of the second trench. The epitaxial silicon layer is the channel region of the NMOS transistor and subject to tensile strain from the SiGe of the second trench. The channel region of the PMOS transistor is in the silicon substrate between the first trenches. The channel region of the PMOS transistor is subject to compressive strain from the SiGe in the first trenches.

DETAILED DESCRIPTION

Figure 1:
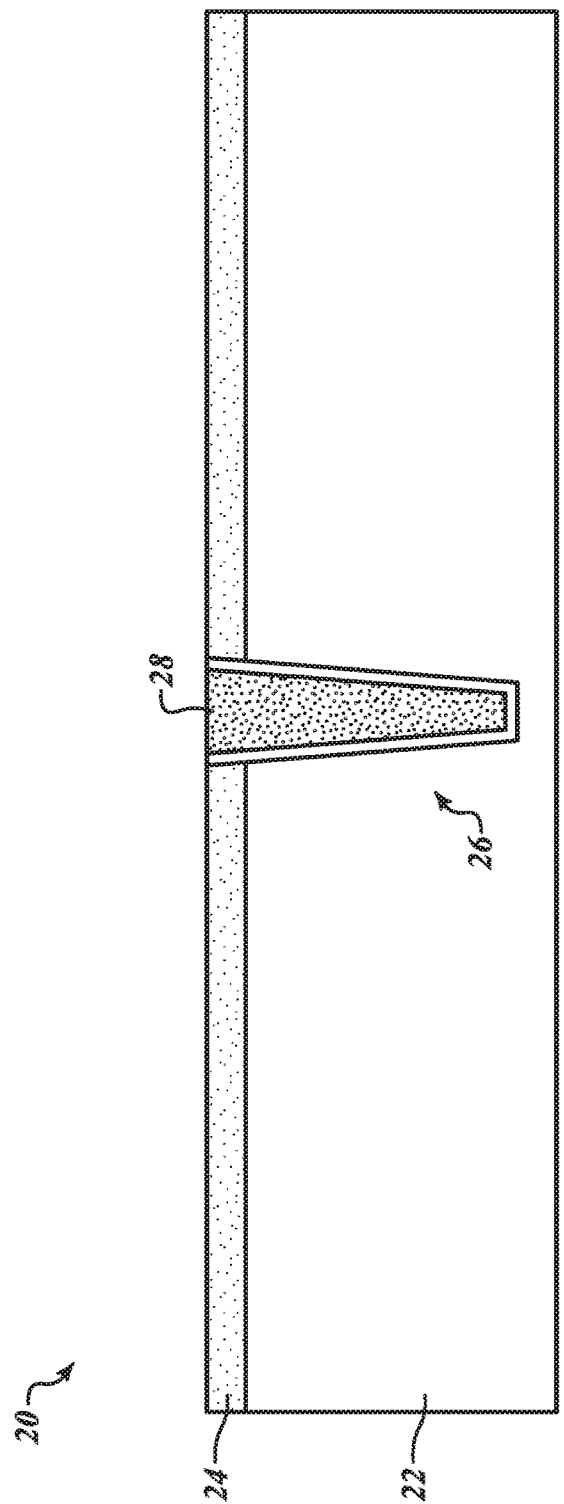
FIG. 1 is a cross-section of an integrated circuit die in which a shallow trench isolation has been formed in a silicon substrate according to one embodiment.

FIG. 1 is a cross-section of an integrated circuit die 20 at an early stage of processing. The integrated circuit die 20 includes a semiconductor substrate 22 and a dielectric layer 24 overlying the semiconductor substrate 22. Usually a thin pad oxide layer of $SiO_2$ is grown on the substrate 22 before dielectric layer 24 is formed as is known in the art. Shallow trench isolation region 26 is formed in the semiconductor substrate 22. The shallow trench isolation region 26 is filled with dielectric material 28.

In one embodiment, the semiconductor substrate 22 is a monocrystalline silicon substrate. The monocrystalline silicon substrate 22 is a 001 silicon lattice having the 110 axis going from left to right.

The dielectric layer 24 is silicon nitride about 50 nm thick. The shallow trench isolation region 26 has been etched through the silicon nitride dielectric layer 24 and the silicon substrate 22. The shallow trench isolation region 26 is about 200-500 nm deep. The dielectric material 28 is a silicon oxide, such as $SiO_2$.

Figure 2:
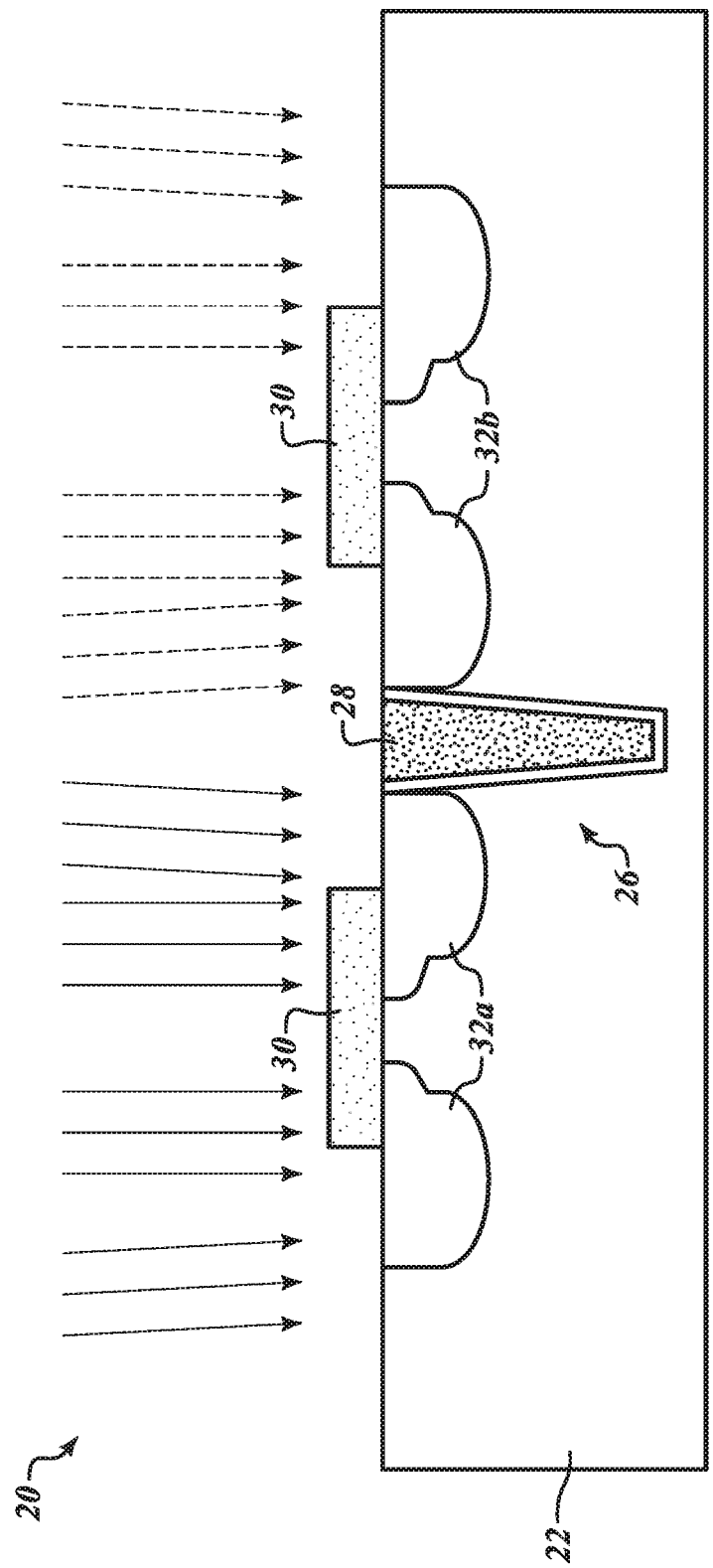
FIG. 2 is a cross-section of the integrated circuit die after source and drain regions have been formed for a PMOS and an NMOS transistor according to one embodiment.

In FIG. 2, the dielectric layer 24 has been removed. The dielectric layer 24 can be removed by etching, without a mask, using an etchant that selectively etches the dielectric layer 24 with respect to the silicon substrate 22. A hard mask 30 is formed on the silicon substrate 22. The hard mask 30 is a dielectric layer that is selectively etchable with respect to the silicon substrate 22. In one example, the hard mask 30 is silicon nitride. The hard mask 30 can be patterned using conventional photolithography techniques. For example, the hard mask 30 can be formed by depositing silicon nitride on the surface of the silicon substrate 22. Photoresist can be deposited in liquid form by a spin on process. In a spin on process, a certain amount of liquid photoresist is placed on the integrated circuit die 20 and the whole integrated circuit die 20 is rotated rapidly causing the liquid photoresist to spread outward to cover the entire integrated circuit die 20. The liquid photoresist is then cured and hardened. A mask is then placed over the integrated circuit die 20 having a pattern corresponding to the hard mask 30 of FIG. 2. The mask is then irradiated with ultraviolet light which is allowed to pass through the mask to irradiate the photoresist according to the pattern of the mask. The irradiated portions of the photoresist undergo a chemical change causing the irradiated portions of the photoresist to be selectively stripped away. The integrated circuit die 20 is then subjected to an acid etch which etches the portions of the dielectric layer left exposed by the removal of the portions of the photoresist, leaving only the hard mask 30 as shown in FIG. 2.

NMOS source and drain regions 32a and PMOS source and drain regions 32b are then formed in the silicon substrate 22 by implanting dopant species into the silicon substrate 22. The NMOS source and drain regions 32a are formed by implanting phosphorous ions into the silicon substrate 22. The phosphorous ions are implanted in two steps. In a first step, phosphorous ions are accelerated toward the silicon substrate 22 at normal incidence as indicated by the straight solid arrows on the left side of FIG. 2. This forms relatively highly doped portions of the NMOS source and drain regions 32a not directly below the hard mask 30 on the left of the integrated circuit die 20. Subsequently, in a second step phosphorous ions are again accelerated toward the silicon substrate 22, but in a direction with a slight angle with respect to normal as indicated by the slanted solid arrows on the left side of the integrated circuit die 20 of FIG. 2. This causes lightly doped portions of the source and drain regions 32a to be formed below the hard mask 30 on the left side of the integrated circuit die 20 of FIG. 2. The lightly doped source and drain regions have a smaller concentration of dopant ions than do the portions of the source and drain regions 32a outside of the hard mask 30 on the left side of the integrated circuit die 20 of FIG. 2.

PMOS source and drain regions 32b are formed in the silicon substrate 22 on the right side of the integrated circuit die 20 of FIG. 2. The PMOS source and drain regions 32b are formed by implanting boron ions into the silicon substrate 22. The boron ions are implanted in two steps. In a first step, boron ions are accelerated toward the silicon substrate 22 at normal incidence as indicated by the straight arrows on the right side of FIG. 2. The boron atoms are implanted into the silicon substrate 22 forming relatively highly doped portions of the PMOS source and drain regions 32b not directly below the hard mask 30 on the right of the integrated circuit die 20. Subsequently, in a second step, boron ions are again accelerated toward the silicon substrate 22, but in a direction having a slight angle with respect to normal as indicated by the slanted dashed arrows on the right side of the integrated circuit die 20 of FIG. 2. This causes lightly doped portions of the source and drain regions 32b to be formed below the hard mask 30 on the right side of the integrated circuit die 20 of FIG. 2. The lightly doped source and drain regions have a smaller concentration of dopant ions than do the portions of the source and drain regions 32b outside of the hard mask 30 on the left side of the integrated circuit die 20 of FIG. 2.

While portions of the hard mask 30 on the left and right sides of FIG. 2 have been described as being formed at the same time in a single photolithography process, those of skill in the art will understand that the portions of the hard mask 30 are formed in separate processes and will have a slightly different appearance than shown with respect to FIG. 2. For example, a first portion of the hard mask 30 will be formed for the implantation of the NMOS source and drain regions 32a. The first hard mask will include the portion on the left side of the integrated circuit die 20 of FIG. 2, but will also cover the entire right side of the integrated circuit die 20 where the PMOS transistor will be formed. After the NMOS source and drain regions 32a have been formed, the hard mask 30 used for forming the NMOS source and drain regions 32a will be stripped away. A separate photolithography process will then be performed to form the hard mask 30 shown on the right side of the integrated circuit die 20 of FIG. 2. The PMOS source and drain implantations will then be performed in the presence of the second hard mask which will also cover the left side of the integrated circuit die 20 of FIG. 2. Those of skill in the art will understand that many processes can be used to form the NMOS and PMOS source and drain regions 32a, 32b.

Figure 3:
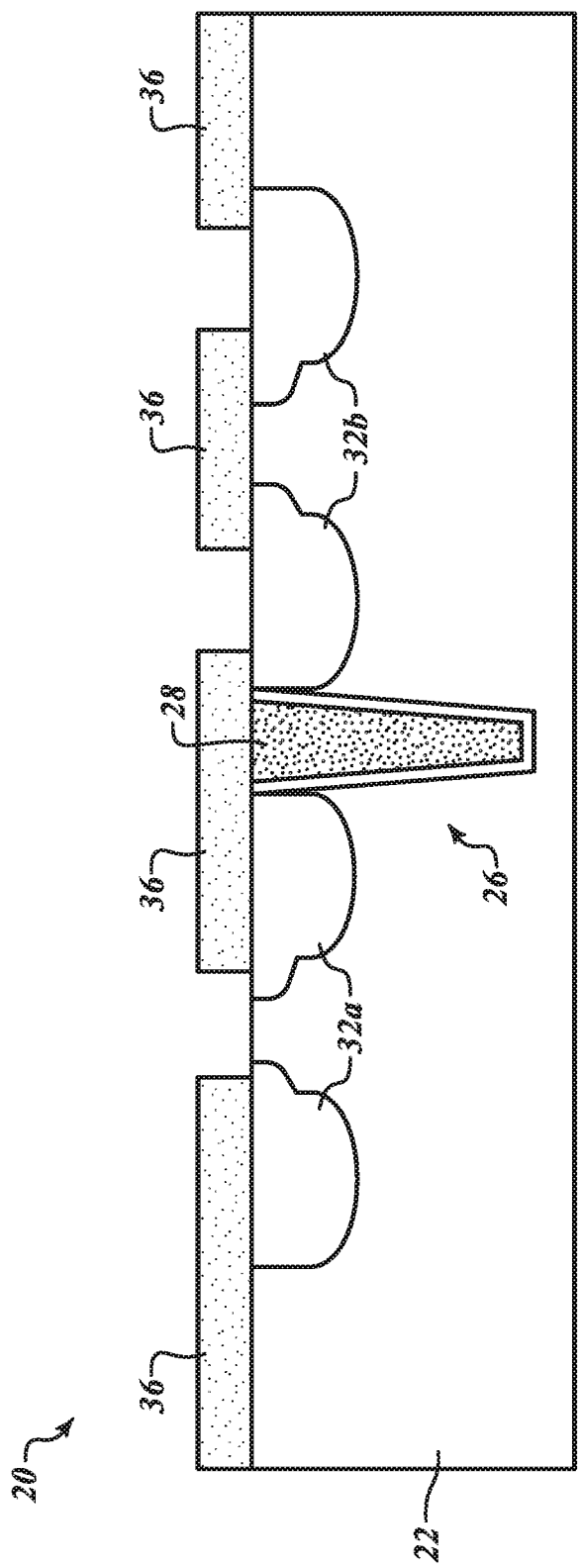
FIG. 3 is a cross-section of the integrated circuit die after a hard mask has been formed for etching trenches in the silicon substrate according to one embodiment.

In FIG. 3, portions of a new hard mask 36 have been formed on the silicon substrate 22. The hard mask 36 is hardened photoresist which has been photo lithographically patterned as described previously in relation to FIG. 2. The portions of the hard mask 36 formed on the right side of the integrated circuit die 20 of FIG. 3 are not simultaneously present with the portions of the hard mask 36 shown on the left side of the integrated circuit die 20 of FIG. 3. As will be described below in relation to FIG. 4, two hard masks will be formed in separate processes to etch separate trenches at separate times on the left and right sides of the integrated circuit die 20.

Figure 4:
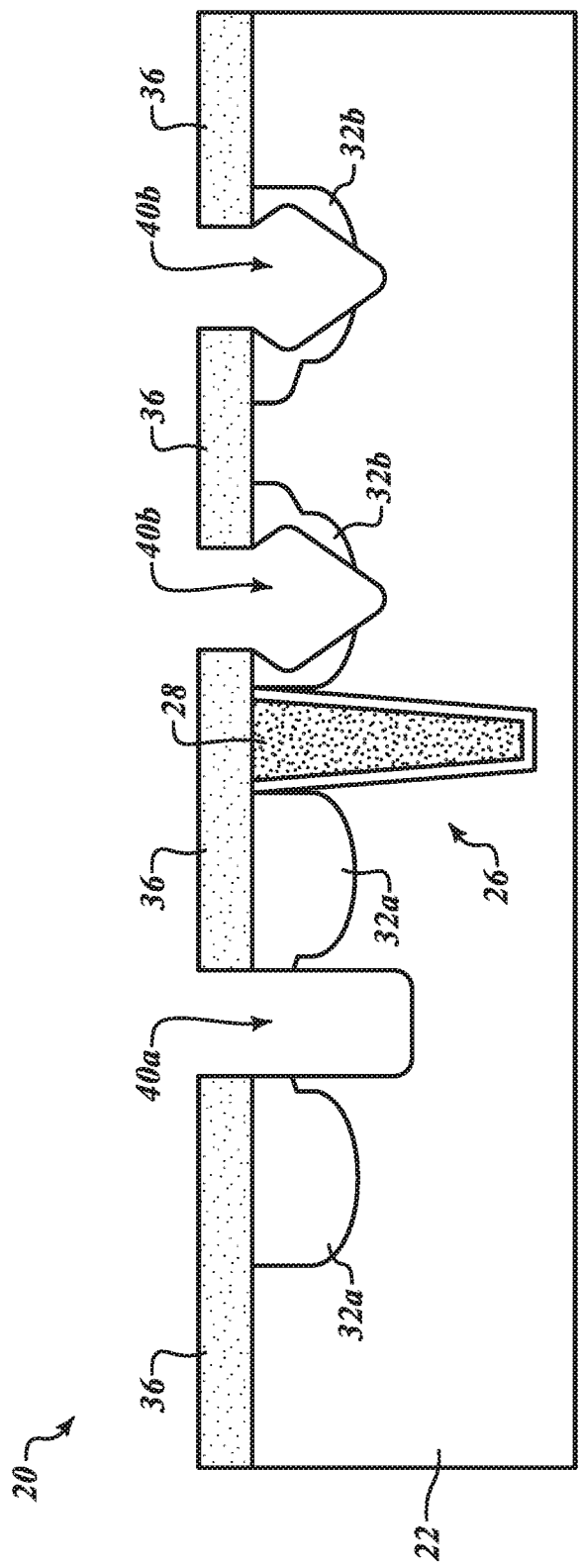
FIG. 4 is a cross-section of the integrated circuit die after trenches have been etched in the silicon substrate according to one embodiment.

In FIG. 4, a first trench 40a has been formed on the left side of the integrated circuit die 20 in the silicon substrate 22 between the NMOS source and drain regions 32a. The first trench 40a is formed by etching the portion of the silicon substrate 22 left exposed by the hard mask 36 as pictured on the left side of the integrated circuit die 20 of FIG. 4. In one example, the first trench 40a is anisotropically etched in the silicon substrate by a reactive ion etching (RIE) process. In the reactive ion etching process, chemically reactive plasma is used to remove material from the silicon substrate 22. The plasma is generated in a vacuum by an intense electromagnetic field. High-energy ions are directed towards the silicon substrate 22, reacting with and etching it. In one example, the plasma is sulfur hexafluoride. Because the plasma comes toward the silicon substrate 22 at normal incidence, RIE produces a very anisotropic etch profile.

The width of the first trench 40a corresponds to the width of the channel region of the NMOS transistor which will be described in more detail below. The width of the first trench 40a therefore corresponds to the technology node at which the integrated circuit die 20 is being processed. For example, if the integrated circuit die 20 is being processed at the 32 nm technology node, then the width of the first trench 40a will be about 32 nm, corresponding to the channel length of the NMOS transistor. The width of the first trench 40a will be different depending on the technology node.

After the first trench 40a is formed, second trenches 40b are formed in the PMOS source and drain regions 32b. The second trenches 40b are formed by isotropically etching the portions of the silicon substrate 22 exposed by the hard mask 36 on the right side of the integrated circuit die 20 of FIG. 4. The silicon substrate 22 can be isotropically etched using a liquid etchant that etches the silicon approximately equally in all directions. In one example, the second trenches 40b are formed by etching the silicon substrate 22 with $NH_4OH$. The cross-sections of the second trenches 40b have a somewhat diamond shape which can be desirable for compressively straining the silicon substrate 22, as will be described in more detail below.

The width of the second trenches 40b corresponds to the width of the channel region of the PMOS transistor which will be described in more detail below. The width of the second trenches 40b therefore corresponds to the technology node at which the integrated circuit die 20 is being processed. For example, if the integrated circuit die 20 is being processed at the 32 nm technology node, then the width of the second trenches 40b will be about 32 nm, corresponding to the channel length of the PMOS transistor. The width of the second trenches will be different depending on the technology node being implemented.

Figure 5:
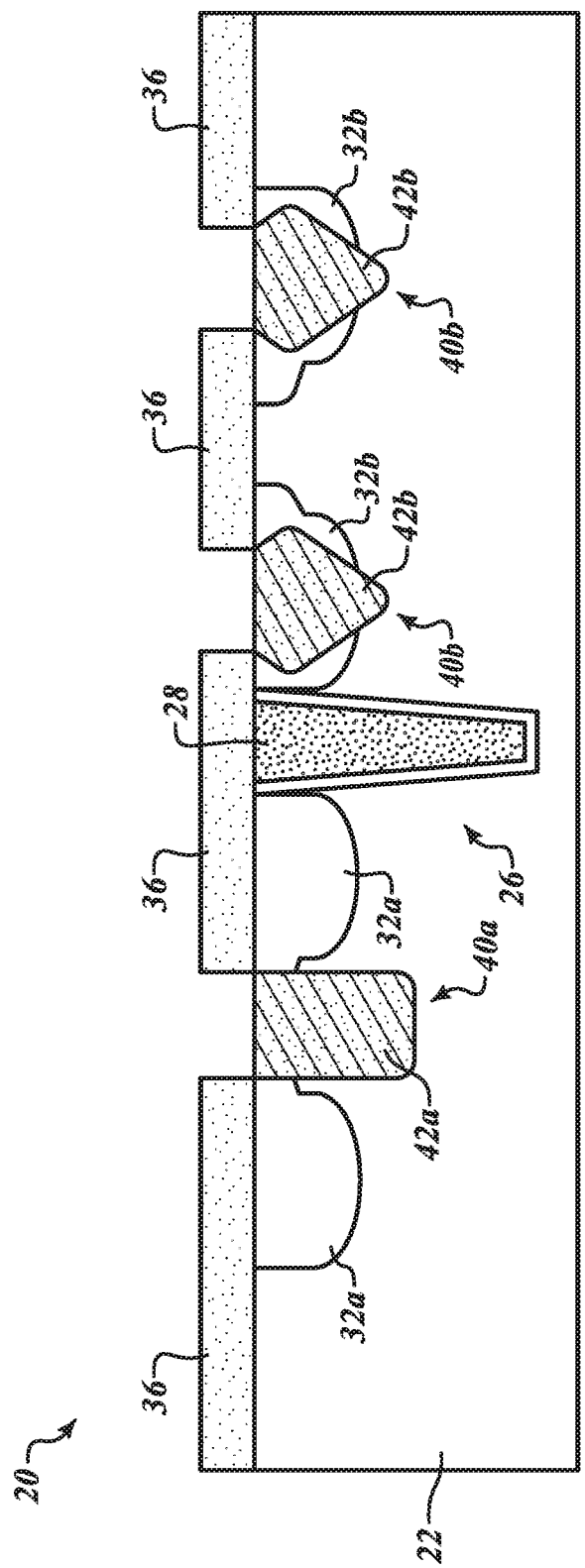
FIG. 5 is a cross-section of the integrated circuit die after the trenches have been filled with SiGe according to one embodiment.

In FIG. 5 a first SiGe region 42a and a second SiGe regions 42b are respectively grown in the trenches 40a and 40b. The SiGe regions 42a, and 42b fill the trenches 40a and 40b. The SiGe regions 42a and 42b are monocrystalline semiconductor regions.

Because the silicon and SiGe have crystal lattice spacings that are similar in size, the SiGe regions 42a and 42b can be formed by an epitaxial growth process. In the epitaxial growth process Si and Ge gases are introduced into the trenches 40a and 40b in particular proportions. When SiGe is formed, the percentage of each of the two elements can vary based on the formula of $Si_{1-x}Ge_x$ in which x is the percentage of Ge. A lower value of x results in a lattice spacing of the SiGe having a relatively small mismatch with respect to the lattice spacing of Si. A higher value of x results in a lattice spacing of the SiGe that is larger mismatch with respect to the lattice spacing of the Si. The mismatch in lattice spacings between SiGe and Si causes strain in the Si. Because the lattice spacing of SiGe is larger than that of Si, a flat silicon layer grown on a flat SiGe layer will undergo tensile strain, which is beneficial to the carrier mobility in NMOS transistors. Applicants have found that particularly shaped regions of SiGe can also induce compressive strain in silicon, as will be described in more detail below. The shape is therefore selected for the trenches 40a and 40b to achieve a desired strain on the channel, whether compressive or tensile.

Figure 6:
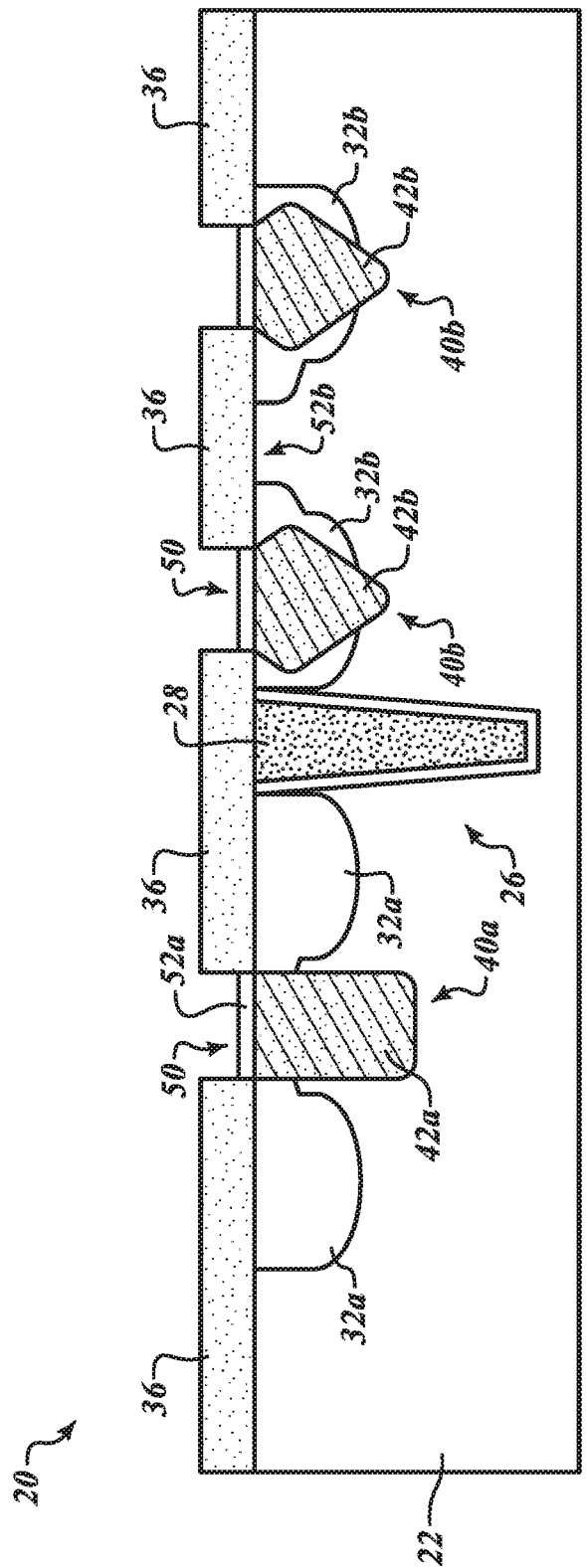
FIG. 6 is a cross-section of the integrated circuit die after an epitaxial silicon layer has been grown on the SiGe according to one embodiment.

In FIG. 6, a thin silicon layer 50 is formed on the SiGe regions 42a, 42b. The thin silicon layer 50 is formed by epitaxial growth from the SiGe regions 42a, 42b and is about 2-20 nm thick. As set forth above, crystalline silicon is lattice-mismatched with respect to crystalline SiGe due to the difference in their lattice spacings. The mismatch is sufficiently small such that the silicon layer 50 can be grown as a single crystal aligned with the single crystal structures of the SiGe regions 42a, 42b.

The portion of the silicon layer 50 above the SiGe region 42a is the channel region 52a of an NMOS transistor, as will be shown in further detail below. The thin silicon layer 50 that is epitaxially grown on the SiGe region 42a will be under tensile strain because the lattice of the thin silicon layer 50 is forced to align to the lattice of the relaxed crystalline SiGe region 42a. The channel region 52a of the NMOS transistor will therefore be under tensile strain, thereby improving the electron mobility in the channel region 52a.

The portion of the silicon substrate 22 between the PMOS source and drain regions 32b is the channel region 52b. Due to the selected shape of SiGe regions 42b on either side of the channel region 52b, the channel region 52b is under compressive strain. Under typical circumstances, monocrystalline silicon adjacent to monocrystalline SiGe will be under tensile strain. However, applicants have determined that when two SiGe regions have a somewhat diamond shape the silicon region between the points of the diamonds will be under compressive strain. Therefore, the channel region 52b of the PMOS transistor is under compressive strain. This causes a beneficial increase in the mobility of holes in the channel region 52b.

Figure 7:
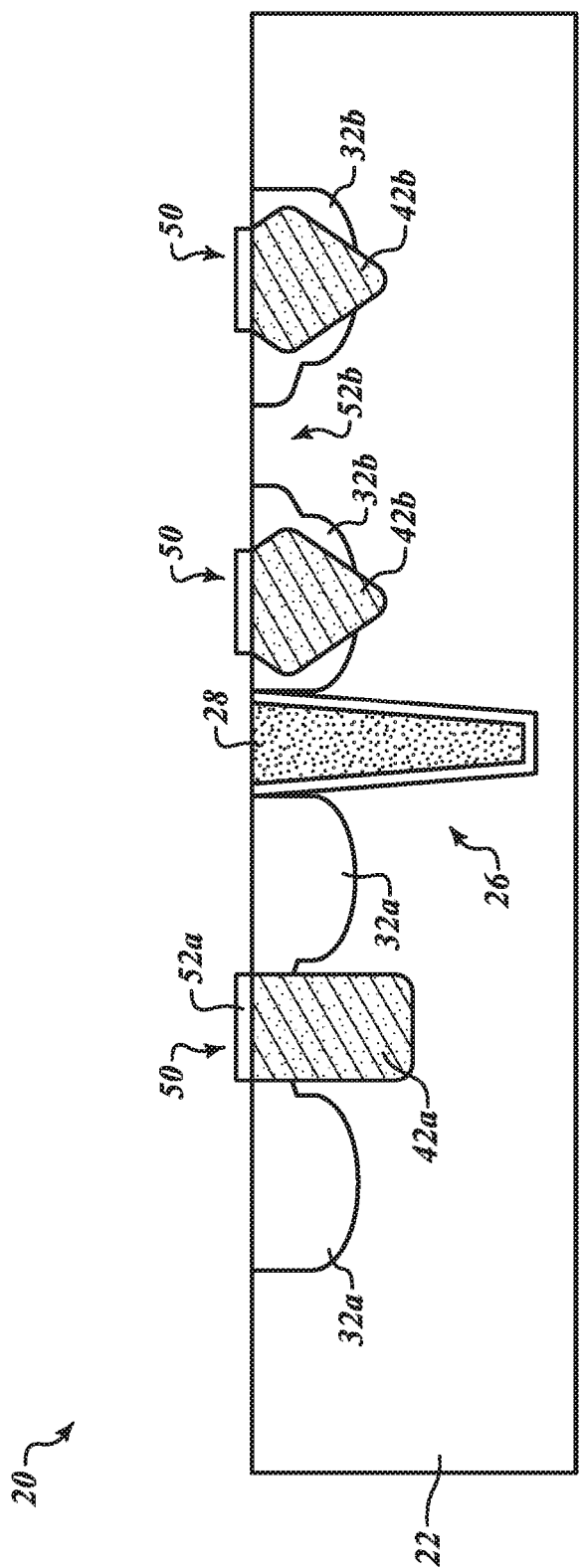
FIG. 7 is a cross-section of the integrated circuit die after the hard mask has been stripped away according to one embodiment.

In FIG. 7, the hard mask 36 has been removed.

Figure 8:
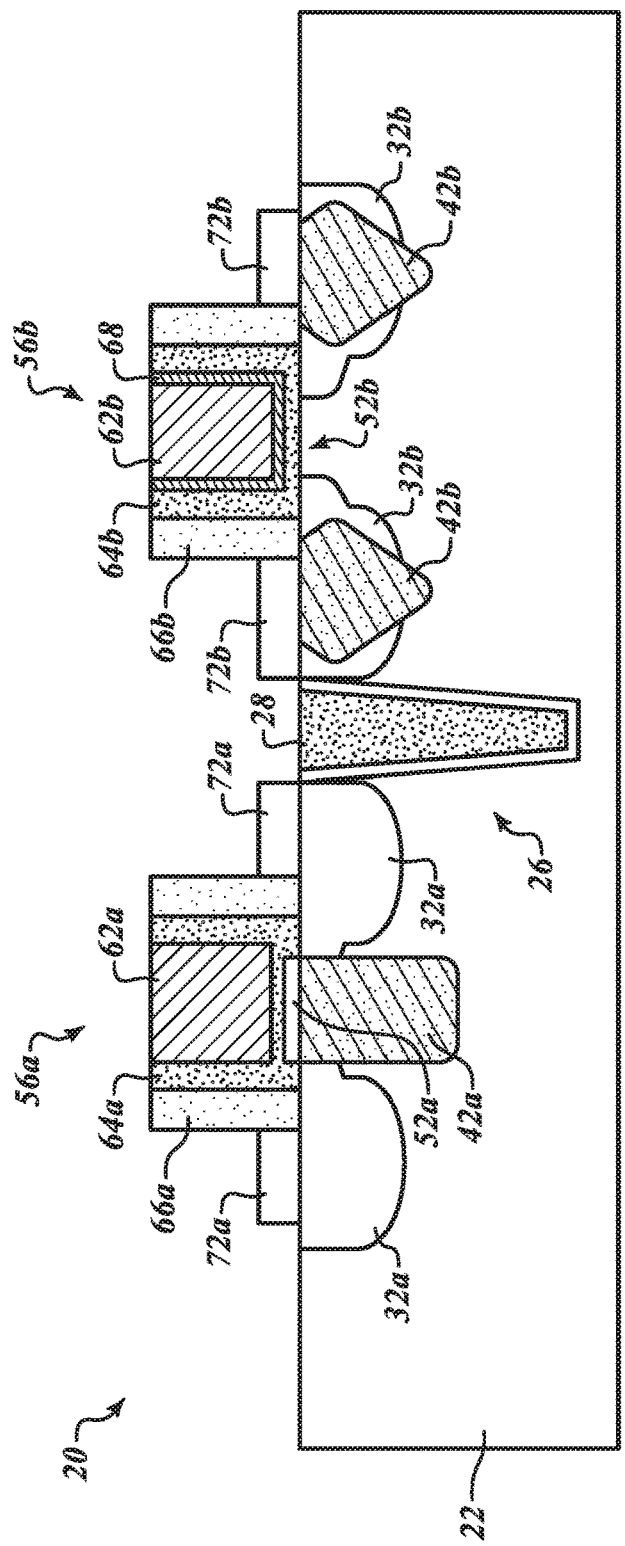
FIG. 8 is a cross-section of the integrated circuit die after gate structures and elevated source and drain regions have been formed for the PMOS and NMOS transistor according to one embodiment.

In FIG. 8, an NMOS transistor 56a is fully formed. The NMOS transistor 56a includes a gate electrode 62a. A gate dielectric 64a separates the gate electrode 62a from the channel region 52a. Sidewall spacers 66a are on the sides of the gate dielectric 64a. Raised source and drain regions 72a are positioned on the source and drain regions 32a.

In one embodiment, the gate electrode 62a is a metal gate electrode, for example, tungsten. The gate dielectric 64a is a high K gate dielectric. A high K gate dielectric is one that has a dielectric constant K that is relatively high compared to other gate dielectrics such as silicon oxide gate dielectrics. One embodiment the high K gate dielectric 64a includes hafnium. Sidewall spacers 66a are, for example, silicon nitride. The sidewall spacer 66a can also include multiple layers of both silicon oxide and silicon nitride. Raised source and drain regions 72a are formed by epitaxial growth from the source and drain regions 32a. The epitaxial growth from the silicon substrate 22 produces raised source and drain regions 72a of a single crystal with the silicon substrate 22. Therefore, though raised source and drain regions 72a are shown as separate layers, in practice they are merely an extension of the source and drain regions 32a of the silicon substrate 22.

The NMOS transistor 56a functions in a similar manner to conventional NMOS transistors. By applying a voltage between the source and drain regions 32a, and by applying a voltage to the gate electrode 62a, a current flows through the channel region 52a. Because the channel region 52a has been formed on SiGe region 42a, the channel region 52a is under tensile strain. This increases the mobility of the electrons in the channel region 52a. This means that a higher drain current will flow through the channel region 52a when given voltages are applied to the source and drain regions 32a and the gate electrode 62a.

In FIG. 8, the PMOS transistor 56b is also fully formed. The PMOS transistor 56b includes a gate electrode 62b. A gate dielectric 64b separates the gate electrode 62b from the channel region 52b. A thin metal layer 68 separates the gate electrode 62b from the gate dielectric 64b. Sidewall spacers 66b are on the sides of the gate dielectric 64b. Raised source and drain regions 72b are positioned on the source and drain regions 32b.

In one embodiment, the gate electrode 62b is a metal gate electrode, for example, tungsten. The gate dielectric is a high K gate dielectric. A high K gate dielectric is one that has a dielectric constant K that is relatively high compared to other gate dielectrics such as silicon oxide gate dielectrics. In one embodiment, the high K gate dielectric 64b includes hafnium. The thin metal layer 68 is, for example, TiN. The thin metal layer 68 helps reduce the work function between the gate electrode 62b and the silicon substrate 22. Sidewall spacers 66b are, for example, silicon nitride. The sidewall spacer 66b can also include multiple layers of both silicon oxide and silicon nitride. Raised source and drain regions 72b are formed by epitaxial growth from the source and drain regions 32b. The epitaxial growth from the silicon substrate 22 produces raised source and drain regions 72b formed of a single crystal with the silicon substrate 22. Therefore, though raised source and drain regions 72b are shown as separate layers, in practice they are merely an extension from the source and drain regions 32b of the silicon substrate 22.

The PMOS transistor 56b functions in a similar manner to conventional PMOS transistors. By applying a voltage between the source and drain regions 32a, and by applying a voltage to the gate electrode 62b, as current flows through the channel region 52b. Because the SiGe regions 42b have been formed in the source and drain regions 32b, the channel region 52b is under compressive strain. This increases the mobility of the holes in the channel region 52b. This means that a higher drain current will flow through the channel region 52b when given voltages are applied to the source and drain regions 32b and the gate electrode 62b.

Although FIGS. 1-8 have described the formation of transistors 56a and 56b in terms of specific materials, processes, and dimensions, those of skill the art will understand that many other materials can be substituted for those described. For example, the semiconductor substrate 22 can be of a material other than silicon. The SiGe regions 42a, 42b can be filled with a material other than SiGe. Many other materials and processes can be used than those described with particularity herein. All such other materials, processes, and dimensions fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate;
   a first source region in the substrate;
   a first drain region in the substrate;
   a first trench in the first source region, the first trench having a non-rectangular shape;
   a second trench in the first drain region, the second trench having a non-rectangular shape;
   a first channel region between the first source region and the first drain region;
   first and second stress inducing materials in the first and second trenches, respectively, the first and second stress inducing materials inducing a first type of strain in the first channel region;
   a first gate structure on the substrate between the first trench and the second trench;
   a second source region in the substrate;
   a second drain region in the substrate;
   a third trench in the substrate and between the second source region and the second drain region, the third trench having a rectangular shape;
   a second channel region between the second source region and the second drain region;

a third stress inducing material in the third trench, the third stress inducing material inducing a second type of strain in the second channel region, the first type of strain and the second type of strain being different from each other; and
a second gate structure on the third trench, the first gate structure having an additional layer that is not included in the second gate structure.

2. The device of claim 1 wherein the first gate structure includes a first dielectric layer, a conductive layer on the first dielectric layer, and a first electrode on the conductive layer.

3. The device of claim 1 wherein the second gate structure includes a second dielectric layer and a gate electrode on the dielectric.

4. The device of claim 1 wherein the second channel region directly overlies the third trench.

5. The device of claim 1 wherein the first source region and the first drain region have a first conductivity type, and the second source region and the second drain region have a second conductivity type different from the first conductivity type.

6. The device of claim 1, further comprising:
a fourth trench in the substrate, the first trench and the second trench being spaced from the third trench by the fourth trench; and
dielectric material in the fourth trench.

7. The device of claim 1 wherein the first strain is a compressive strain and the second strain is a tensile strain.

8. The device of claim 1 wherein the first channel region is below a surface of the substrate, and the second channel region is above the surface of the substrate.

9. A device, comprising:
a substrate having a surface;
a source region in the substrate;
a drain region in the substrate;
a trench extending from the surface of the substrate and into the substrate, the trench positioned between the source region and the drain region;
stress inducing material in the trench, the stress inducing material positioned below the surface of the substrate;
a channel on the stress inducing material; and
a gate structure on the channel, the channel positioned above the surface of the substrate and between the surface and the gate structure.

10. The device of claim 9, further comprising:
a raised source region on the source region; and
a raised drain region on the drain region.

11. The device of claim 9 wherein the source region is an n-type source region and the drain region is an n-type drain region.

12. The device of claim 9 wherein the stress inducing material is SiGe.

13. The device of claim 9 wherein the source region extends into the substrate to a first depth, the drain region extends into the substrate to a second depth, and the trench extends into the substrate to a third depth that is greater than the first depth and the second depth.

14. The device of claim 9 wherein the trench has substantially straight sides.

15. The device of claim 9 wherein the gate structure includes:
a dielectric;
a gate electrode on the dielectric; and
first and second sidewall spacers, the dielectric and the gate electrode positioned between the first and second sidewall spacers.

16. A device, comprising:
a substrate having a surface;
a source region extending from the surface of the substrate and into the substrate;
a drain region extending from the surface of the substrate and into the substrate;
a first strain-inducing region in the source region, the first strain-inducing region having angled sides extending below a lowermost boundary of the source region and converging toward a tip in the substrate, an outermost boundary of the angled sides of the first strain-inducing region being above the lowermost boundary of the source region, the first strain-inducing region including strain-inducing material, the first strain-inducing region having a surface that is coplanar with the surface of the substrate;
a second strain-inducing region in the drain region, the second strain-inducing region having a non-rectangular shape, the second strain-inducing region including strain inducing material, the second strain-inducing region having a surface that is coplanar with the surface of the substrate; and
a gate structure between the source region and the drain region.

17. The device of claim 16 wherein the second strain-inducing region has angled sides extending below a lowermost boundary of the drain region and converging toward a tip in the substrate, an outermost boundary of the angled sides of the second strain-inducing region being above the lowermost boundary of the drain region.

18. The device of claim 16 wherein the gate structure includes:
a dielectric;
a conductive layer on the dielectric;
a gate electrode on the conductive layer; and
first and second sidewall spacers, the dielectric, the conductive layer, and the gate electrode positioned between the first and second sidewall spacers.

19. The device of claim 16, further comprising:
a raised source region on the surface of the first strain-inducing region; and
a raised drain region on the surface of the second-strain inducing region.

20. The device of claim 16 wherein the source region is a p-type source region and the drain region is a p-type drain region.

21. The device of claim 16 wherein the stress inducing material is SiGe.

22. A device, comprising:
a substrate having a surface;
a first source region in the substrate;
a first drain region in the substrate;
a first trench in the first source region, the first trench having a non-rectangular shape;
a second trench in the first drain region, the second trench having a non-rectangular shape;
a first channel region between the first source region and the first drain region, the first channel region being below the surface of the substrate;
first and second stress inducing materials in the first and second trenches, respectively, the first and second stress inducing materials inducing a first type of strain in the first channel region;
a first gate structure on the substrate between the first trench and the second trench;
a second source region in the substrate;
a second drain region in the substrate;

a third trench in the substrate and between the second source region and the second drain region, the third trench having a rectangular shape;

a second channel region between the second source region and the second drain region, the second channel region being above the surface of the substrate;

a third stress inducing material in the third trench, the third stress inducing material inducing a second type of strain in the second channel region, the first type of strain and the second type of strain being different from each other; and a second gate structure on the third trench.

23. The device of claim 22 wherein the second channel region directly overlies the third trench.

24. The device of claim 22 wherein the first source region and the first drain region have a first conductivity type, and the second source region and the second drain region have a second conductivity type different from the first conductivity type.

25. The device of claim 22, further comprising:

a fourth trench in the substrate, the first trench and the second trench being spaced from the third trench by the fourth trench; and dielectric material in the fourth trench.

* * * * *